(12) United States Patent
Elmhurst et al.

(10) Patent No.: US 7,535,787 B2
(45) Date of Patent: May 19, 2009

(54) METHODS AND APPARATUSES FOR REFRESHING NON-VOLATILE MEMORY

(76) Inventors: Daniel Elmhurst, 1004 Smith Way, Folsom, CA (US) 95630; Violante Moschiano, Via Nerva 91, Bacoli, NA 80070 (IT); Paul Ruby, 107 Briarcliff Ct., Folsom, CA (US) 95630

( * ) Notice: Subject to any disclaimer, the term of this patent is extended or adjusted under 35 U.S.C. 154(b) by 0 days.

(21) Appl. No.: 11/810,550

(22) Filed: Jun. 6, 2007

(65) Prior Publication Data

US 2008/0304327 A1 Dec. 11, 2008

(51) Int. Cl.
*G11C 7/00* (2006.01)
(52) U.S. Cl. .................. 365/222; 365/201; 365/185.09
(58) Field of Classification Search .............. 365/222, 365/201, 185.09
See application file for complete search history.

(56) References Cited

U.S. PATENT DOCUMENTS

| | | | |
|---|---|---|---|
| 6,058,047 A * | 5/2000 | Kikuchi | ................. 365/185.33 |
| 6,151,246 A | 11/2000 | So et al. | |
| 6,178,117 B1 | 1/2001 | Cleveland | |
| 6,307,776 B1 | 10/2001 | So et al. | |
| 6,493,270 B2 | 12/2002 | Chevallier | |
| 6,584,019 B1 | 6/2003 | Chevallier | |
| 6,650,585 B2 | 11/2003 | Chevallier | |
| 6,661,720 B2 | 12/2003 | Chevallier | |
| 6,853,598 B2 * | 2/2005 | Chevallier | .................. 365/201 |
| 6,898,117 B2 * | 5/2005 | So et al. | ................. 365/185.03 |
| 6,992,933 B2 | 1/2006 | Iwase et al. | |
| 7,038,950 B1 | 5/2006 | Hamilton et al. | |
| 7,079,422 B1 | 7/2006 | Wong | |
| 7,170,781 B2 | 1/2007 | So et al. | |
| 7,170,791 B2 | 1/2007 | Iwase et al. | |
| 7,310,757 B2 * | 12/2007 | Ngo et al. | .................. 714/725 |
| 2006/0233020 A1 | 10/2006 | Ruby et al. | |
| 2007/0058439 A1 | 3/2007 | Kuo et al. | |

* cited by examiner

*Primary Examiner*—Huan Hoang
*Assistant Examiner*—Kretelia Graham
(74) *Attorney, Agent, or Firm*—Schubert Osterrieder & Nickelson PLLC; Garland D. Charpiot

(57) ABSTRACT

Methods and apparatuses for refreshing non-volatile memories due to changes in memory cell charges, such as charge loss, are disclosed. Embodiments generally comprise a voltage generator to create a sub-threshold voltage for a memory state of memory cells in a block. Once the sub-threshold voltage is applied to a word line a state reader determines states of memory cells coupled to the word line. If the state reader determines that one or more of the memory cells coupled to the word line is in the memory state, despite the sub-threshold voltage, a memory refresher may program a number of memory cells in the block. Method embodiments generally comprise applying a sub-threshold voltage to a word line for a plurality of memory cells, detecting at least one memory cell of the plurality violates a state parameter, and refreshing a block of memory cells associated with the plurality of cells.

15 Claims, 4 Drawing Sheets

METHODS AND APPARATUSES FOR REFRESHING NON-VOLATILE MEMORY

FIELD

The embodiments herein generally relate to the field of non-volatile memory devices. More particularly, the embodiments relate to methods and apparatuses for refreshing non-volatile memories due to changes in memory cell charges, such as charge loss.

BACKGROUND

Many different types and styles of semiconductor memory devices exist to store data for electronic devices such as computers, portable media players, and digital cameras. For example, dynamic random access memory and static random access memory are two types of volatile memory. Programmable read only memory, electrically erasable programmable read only memory (EEPROM), and flash memory are three common types of non-volatile memory.

Non-volatile memory is generally constructed of many memory cells where single bits of data are stored in and read from individual memory cells in a memory array. A typical memory cell in the memory array, such as a flash memory cell in a flash memory array, comprises a single field effect transistor having a control gate, a floating gate, a source, and a drain. The cells are generally programmed by hot electron injection and erased by Fowler-Nordheim tunneling or other mechanisms. The erase, program, and read operations are commonly performed by application of appropriate voltages to certain terminals of the memory cells. In erase and write operations, the voltages are applied to the memory cells and cause charges to either be removed or stored in the memory cells. In read operations, generally, threshold voltages (Vt) are applied to the cells which cause currents to flow in the cells, wherein the amounts of such currents are indicative of the values of the data stored in the cells. The memory devices generally include circuitry to sense the resulting cell currents in order to retrieve data stored in the cells.

As manufacturers decrease the size of the individual memory cells, the capacity of memory devices to store data is gradually being increased by increasing the number of memory cells available per unit area. Unfortunately, reducing the size of the memory cells tends to make them more vulnerable to leakage. Leakage is an unwanted loss of charge from the floating gate of a memory cell and may occur for a variety of reasons. Data retention may deteriorate as charge slowly drifts out of the floating gate over the operating life of the memory device. Environmental conditions in which the memory device operates, such as temperature, may affect or result in leakage. Leakage may also occur when the memory cell is disturbed. When a memory cell is being programmed, erased, or read, its word line, or bit line, or both, may be coupled to a voltage that is elevated in either a positive or negative direction. Adjacent memory cells sharing the same word line or bit line will also receive the elevated voltage which may disturb voltage differentials between the control gates, drains, and sources of the adjacent memory cells. The disturbance may cause charge to leak from the floating gates of some of the adjacent memory cells. Depending on the array structure multiple cycles of programming or an erase of memory cells in a block could induce leakage in cells in different blocks in the array. If sufficient leakage occurs in a programmed memory cell over its lifetime it may gradually move to a state in which a read operation will indicate that it is erased, or, that the state of the cell differs from its originally programmed state. This is referred to as a bit failure or charge loss for a memory cell.

To combat the problem of bit failure, prior art devices may reprogram or refresh the cells that are on the verge of bit failure. Prior art devices generally examine a single cell, detect that the threshold voltage for the programmed state is declining, and reprogram the cell adding a sufficient amount of charge back to the cell. Such devices generally repeat this process of reading, detecting, and reprogramming individual cells, one at a time, until all memory cells of the device have been refreshed. Unfortunately, this refreshing process generally consumes a large amount of time to complete. Consequently, the refresh operations tend to significantly impact performance of the memory devices. Additionally, no methods exist to detect when groups of memory cells, such as memory blocks, are on the verge of changing states due to charge loss.

BRIEF DESCRIPTION OF THE DRAWINGS

Aspects of the embodiments will become apparent upon reading the following detailed description and upon reference to the accompanying drawings in which like references may indicate similar elements.

DETAILED DESCRIPTION OF EMBODIMENTS

Figure 1:
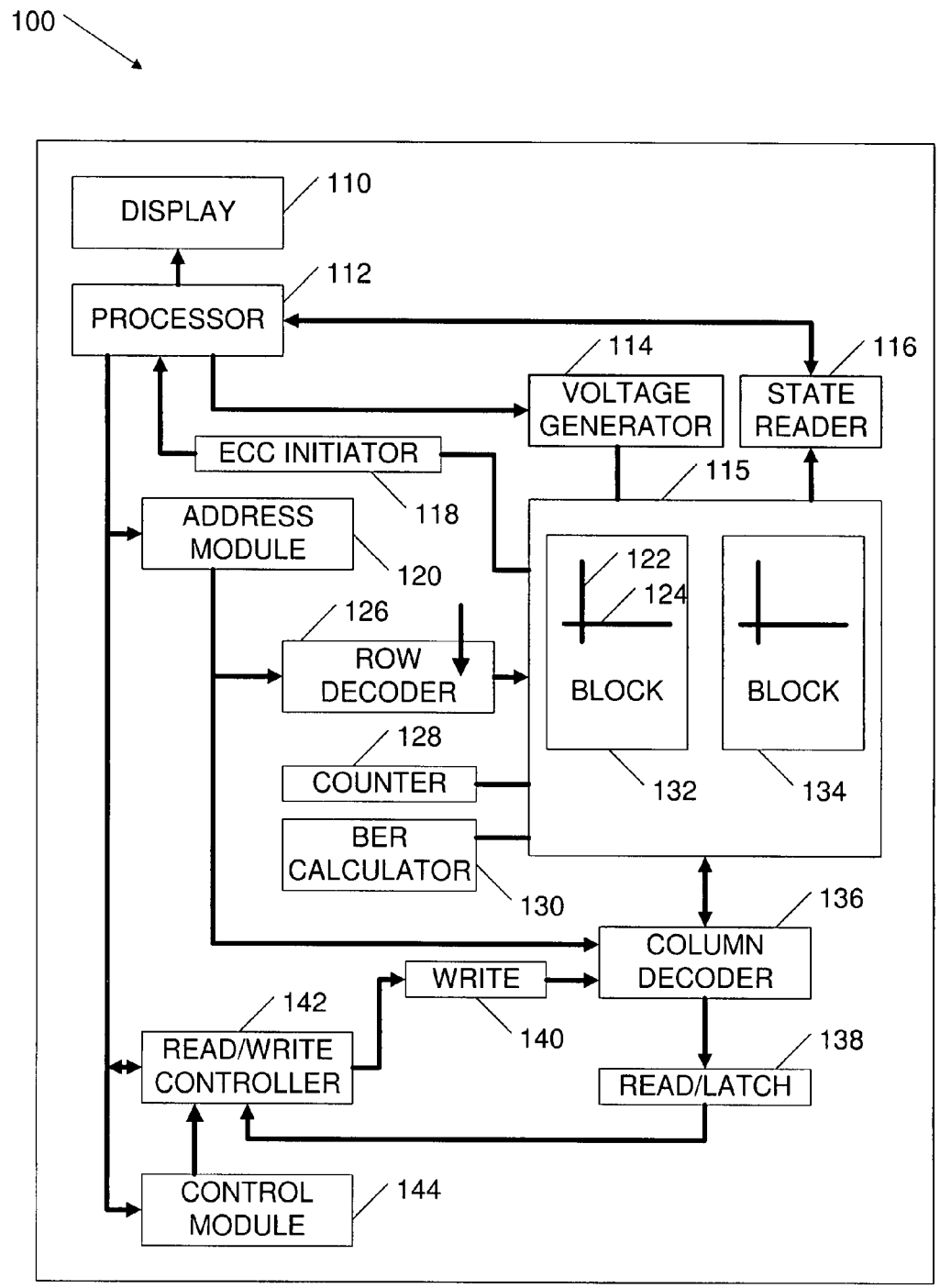
FIG. 1 depicts an apparatus capable of detecting charge loss and refreshing non-volatile memory, comprising a processor coupled with an address module and a read/write controller, a voltage generator, a state reader, and a non-volatile memory array comprising two blocks of memory cells.

The following is a detailed description of embodiments depicted in the accompanying drawings. The specification is in such detail as to clearly communicate the embodiments. However, the amount of detail offered is not intended to limit the anticipated variations of embodiments; but on the contrary, the intention is to cover all modifications, equivalents, and alternatives consistent with the spirit and scope of the embodiments as defined by the appended claims.

Generally speaking, methods and apparatuses for refreshing non-volatile memories due to changes in memory cell charges, such as charge loss. Apparatus embodiments generally comprise a voltage generator to create a voltage for a word line in a block of memory cells. In these embodiments, the voltage generator voltage generator applies a voltage that is below a threshold voltage for a memory state of the memory cells. Once the sub-threshold voltage is applied to the word line a state reader determines states of one or more memory cells coupled to the word line. If the state reader determines that one or more of the memory cells coupled to the word line are in the memory state a memory refresher may program a number of memory cells in the block.

An alternative embodiment may include a counter to count the number of memory cells that the state reader determines is in the memory state. The embodiment may perform a bit error rate calculation based on the number of memory cells and perform a refresh on the entire block or a certain number of memory cells in the block. Other alternative embodiments may comprise a read/write controller to allow the state reader to determine states during an erase operation, a program operation, or during power-up of the apparatus. Even further alternative embodiments may have a cycle counter to initiate the check and refresh process once the block has experienced a series of operating cycles, such as write cycles.

Alternative apparatus embodiments may include an error correction code initiator to initiate the determination of the state reader when the block experiences an error number of reads requiring error correction. The memory cells coupled to the word lines may have a predetermined test pattern. For example, the memory cells may have a series of alternating ones and zeros. In other embodiments, the memory cells coupled to the word lines may all be of the same state, such as level 2 (L2) or level 3 (L3).

Method embodiments generally comprise applying a sub-threshold voltage to a word line for a plurality of memory cells, detecting at least one memory cell of the plurality violates a state parameter, and refreshing a block of memory cells associated with the plurality of cells. For example, a method embodiment may detect that one or more of the memory cells violate a maximum permissible threshold current of the state. Alternatively, a method embodiment may detect that one more than memory cells violate a state parameter when the cell or cells become forward biased with the application of the sub-threshold voltage. Some method embodiments may refresh the block of memory cells by loading states of the cells for each word line of the block into a dynamic data cache and reprogramming the cells for each word line.

While portions of the following detailed discussion describe embodiments to program memory cells of NAND flash memory arrays, persons of ordinary skill in the art will recognize that alternative embodiments may program memory cells in other types of non-volatile memory devices, such as NOR flash memory or EEPROM memory devices. Similarly, persons of ordinary skill in the art will recognize that even though embodiments described herein generally refer to non-volatile memory cells capable of storing multiple bits, such as two bits, memory cells of alternative embodiments may store only one bit, or more bits than two, such as four bits. Even further, persons of ordinary skill in the art will also recognize that while many of the embodiments described in the specification refer to refreshing memory cells in blocks, alternative embodiments may involve refreshing memory cells in various quantities and various sized groups.

Turning now to the drawings, FIG. 1 depicts an apparatus 100 capable of detecting charge loss and refreshing non-volatile memory. Apparatus 100 comprises a processor 112 coupled with a display 110. Processor 112 may comprise a single or multiple-core processor in various embodiments, and may even comprise multiple processors. For example, processor 112 may have four cores coupled with internal processor cache memory. Processor 112 may execute operating instructions for programs and applications run by users of apparatus 100, such as instructions of a web browser in a personal digital assistant (PDA) or instructions of a program which manages a list of telephone numbers in a cellular telephone, and display results of the programs and applications on display 110. The examples of apparatus being a PDA or a cellular telephone are illustrative. In alternative embodiments, apparatus 100 may comprise a desktop computer, a laptop computer, a portable non-volatile storage device such as a flash drive, a portable media player, a stereo, a video camera, an electronic module in an automobile or other transportation system, etc.

Processor 112 may be coupled with an address module 120, a read/write controller 142, a voltage generator 114, a state reader 116, and a non-volatile memory array 115 comprising two blocks of memory cells 132 and 134. In one embodiment, non-volatile memory array 115 may comprise an array of non-volatile floating-gate memory cells, having individual memory cells arranged in blocks by rows and columns. In various embodiments, the size, organization, and other parameters will differ for non-volatile memory array 115. As examples, page sizes of non-volatile memory array 115 may be 512, 2048, or 4096 bytes, while block sizes may be 32 pages of 512 bytes, or 64 pages of 2048 bytes. Some embodiments may have 32 word lines per block, while other embodiments have 64 word lines per block. Even further, the number of bits stored in the individual cells of a memory cell may vary, such as 1 bit, 2 bits, or more. For example, in one embodiment memory cells of non-volatile memory array 115 may store 2 bits. Corresponding state values of the two bits may be 11, 01, 00, and 10, represented by state levels L0, L1, L2, and L3, respectively. The threshold voltages of L1, L2, and L3 may be 1 volt, 2 volts, and 3 volts, respectively. These parameters are merely examples. The exact parameters may differ from these examples and may vary from one embodiment to the next.

Address module 120 may latch address signals provided on address input connection from processor 112. Both row decoder 126 and column decoder 136 may receive and decode address signals from address module 120, translating addresses into block, row, and column numbers to access individual memory cells in non-volatile memory array 115. As an example, for a given bit of an address, row decoder 126 and column decoder 136 may pinpoint which column 122 and which row 124 in block 132 need to be accessed in order to read the state of a memory cell for the bit from non-volatile memory array 115. The number of addresses may depend on the density and architecture of in non-volatile memory array 115. That is, the number of addresses will generally increase with both an increase in number of memory cells and increased block counts.

Apparatus 100 reads data in non-volatile memory array 115 by sensing magnitudes of voltage or current in the memory array columns using read/latch module 138. Read/latch module 138, in the embodiment shown in FIG. 1, is coupled to column decoder 136 in order to read and latch a row of data from non-volatile memory array 115. Read/write controller 142 may provide bi-directional data communication with processor 112. Write module 140 may write data to non-volatile memory array 115.

Control module 144 may decode signals provided from processor 112. These signals may be used to control the operations for non-volatile memory array 115, including data read, data write, and erase operations. In one embodiment, control module 144 may work in conjunction with read/write controller 142 to improve performance of apparatus 100. For example, control module 144 may facilitate background operations. Control module 144 may allow apparatus 100 to perform an erase operation in one plane of non-volatile memory array 115 while detecting charge loss and/or refreshing memory cells in a second plane. Control module 144 may also count the number of write operations for non-volatile memory array 115, enabling a memory refresh of non-volatile memory array 115 after a certain number of write cycles. Such counting may occur, as examples, at the array level, for each of the planes, or even for each of the individual blocks or subparts of the blocks of non-volatile memory array 115. Control module 144 may be a state machine, a sequencer, or some other type of controller.

The configuration of apparatus 100 will vary from embodiment to embodiment. Various embodiments may contain more or fewer elements. For example one embodiment may not have control module 144 but have processor 112 perform the functions that control module 144 might otherwise perform. Similarly, some embodiments may not have an error correction code (ECC) initiator 118, a counter 128, or a bit error rate calculator 130. Alternatively, some embodiments may have different elements perform different functions than those described for the embodiment shown in FIG. 1. For example, control module 144 may operate voltage generator 114 and state reader 116, instead of processor 112 operating them. In other words, alternative embodiments may perform the same or similar functions using different configurations of hardware.

Apparatus 100 may detect charge loss and perform refresh of memory in non-volatile memory array 115. Blocks in non-volatile memory array 115 may contain one additional word line which may be used to allow bit error rate checks. The additional word line may contain an internally loaded test pattern to capture effects of charge loss over cycling and time. Such a word line may be considered a "canary" word line because it may provide an indication of when a block is suffering from charge loss.

Figure 2:
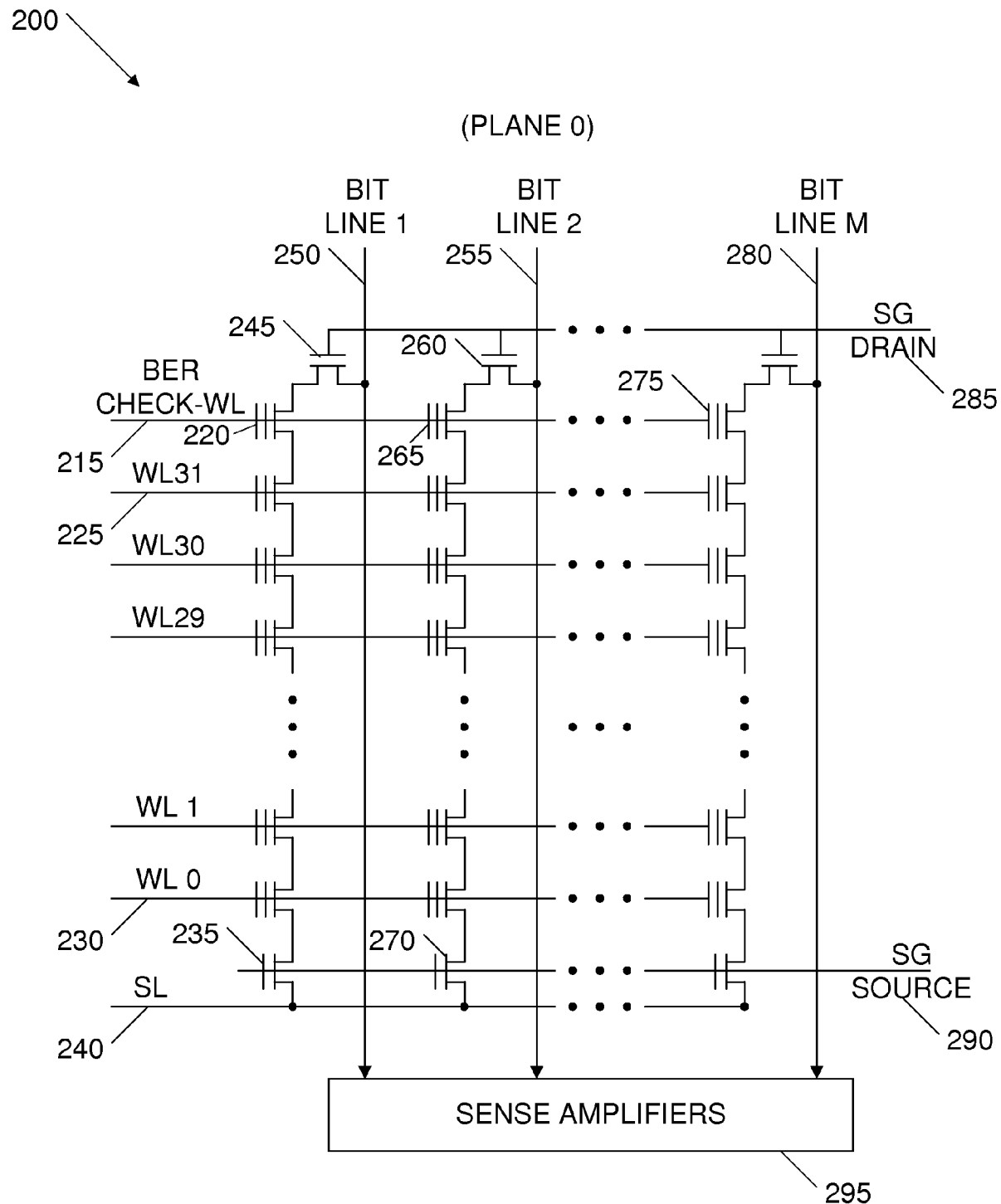
FIG. 2 shows a block of non-volatile memory cells having a bit error rate check word line which may be used to detect charge loss of memory cells in the block.

To better illustrate this concept of using a canary word line to detect charge loss and refresh memory, we turn now to FIG. 2. FIG. 2 shows a block 200 of non-volatile memory cells from a NAND flash memory array having a bit error rate (BER) check word line (WL) 215 which may be used to detect charge loss of memory cells in block 200. Block 200 of FIG. 2, for clarity, does not show all of the elements required in a complete block or memory array. For example, only three bit lines are shown (bit lines 250, 255, and 280) when the number of bit lines required may depend upon the memory density.

In addition to BER check WL 215, block 200 may contain 32 other word lines, such as word line 230 through word line 225. A word line may span multiple series-strings of floating gate cells associated with individual bit lines. Bit lines 250, 255, and 280 are eventually coupled to sense amplifiers 295 that detect the state of each cell. In operation, word lines 230 through 225 select the individual floating gate memory cells in the series-string of memory cells to be written to or read from and operate the remaining floating gate memory cells in a pass through mode. Each of the series-strings of memory cells coupled to the individual bit lines is coupled to a source line 240 by source select gates, such as gates 235 and 270, and to an individual bit line by drain select gates, such as gates 245 and 260. The source select gates (i.e. 235 and 270) are controlled by a source select gate control line 290 coupled to their control gates. The drain select gates (i.e. 245 and 260) are controlled by a drain select gate control line 285.

During a programming operation, the selected word line for the flash memory cell to be programmed may be biased with a series of incrementing voltage programming pulses that start at an initial voltage that is greater than a predetermined programming voltage (e.g., approximately 16V). After each programming pulse, a verification operation may be performed to determine if the threshold voltage, Vt, of the cell has increased to the properly programmed level (e.g., 3V for an L3 memory cell). The unselected word lines for the remaining cells may be biased at a voltage that is different from than the programming voltage (e.g., approximately 10V) during the program operation. Each of the memory cells may be programmed in a substantially similar fashion.

As noted, BER check WL 215 may be used to detect charge loss of memory cells in block 200. To detect charge loss, a voltage generator may create a sub-threshold voltage and apply it to BER check WL 215. For example, apparatus 100 of FIG. 1 may cause voltage generator 114 to apply a voltage which is lower than the threshold voltage of a particular state for word line (WL) memory cells 220, 265, and 275. In such an example, BER check WL 215 may comprise a canary word line in block 132 or block 134. All WL memory cells of the canary word line may each contain the same bit pattern, or test pattern. Each WL memory cell may be programmed to L2 or L3, containing bits "00" or "10", respectively. For the sake of a particular example, assume that each memory cell coupled to BER check WL 215 is programmed to the L3 state, having a voltage threshold of 3 volts. Applying a sub-threshold voltage of 2.7 volts, all bits or WL memory cells coupled to BER check WL 215 should read zero. If any of the WL memory cells indicate that they are in the L3 state even though the voltage is only a sub-threshold voltage, then this false state reporting may violate acceptable cell state parameters and indicate a charge loss in block 200.

Having determined that there is at least some amount of charge loss in block 200, an embodiment may determine if the charge loss is sufficient to warrant a refresh of the memory. For example apparatus 100 may ignore some bit error rates, such as bit error rates equaling 0.00005%, but may refresh block 200 when there is a more significant charge loss, such as a when the BER calculates to 0.001% or greater. For example, to determine the bit error rate apparatus 100 count the total number of bits which indicate being in-state L3 with the sub-threshold voltage applied using counter 128. In other words, counter 128 may count the quantity of memory cells that state reader 116 determines is in the L3 state, even though a sub-threshold voltage is applied. After the total charge loss bits are counted, BER calculator 130 may divide the total number of counted bits, or quantity of memory cells counted, by the total number of bits or memory cells which are read or sampled. Such calculation may include sector-level bit and byte counters that apparatus 100 may employ.

Assuming that an unacceptable amount of bits coupled to BER check WL 215 have experienced charge loss, an apparatus comprising block 200 may perform a refresh of the data stored in word lines 230 through 225. The apparatus may load word lines 230 through 225 into a device, such as a dynamic data cache, and rewrite the data back to the respective word line from which it was read. Some embodiments may refresh all of the data in block 200. Alternative embodiments may refresh only memory cells that are programmed to the L3 state, which is the state used to detect charge loss. Refreshing only L3 cells may allow a higher initial programming voltage and speed up the overall operation of refreshing the memory cells. One may note that in refreshing the memory cells, the actual threshold voltage applied to the word line being read may need to be set above the normal read level to correctly read the data into the dynamic data cache even though charge loss is present. For example, BER check WL 215 may need to be set at 3.2 volts to properly read the data.

Some embodiments of block 200 may detect charge loss in the background during a program and/or erase operation. For example one embodiment may detect charge loss in the background during an erase operation, but perform the check in the unused plane. In this example, the apparatus may detect charge loss in plane 0 while an erase operation is being performed in plane 1. Such an embodiment may require an internal read-while-write controller, such as read/write controller 142 depicted in FIG. 1. Such an embodiment may allow for a refresh operation independent of the erase operation. If a refresh of memory is required, the apparatus may extend the erase time to allow for the refresh operation to complete. Alternative embodiments may perform the check and/or refresh operations simultaneous with other operations, such as when programming another plane or during power-up of the apparatus.

Some embodiments may perform a check for memory loss periodically, such as once a day. Other embodiments may perform a check only after a block has exceeded a minimum cycle count threshold. For example, counter 128 shown in FIG. 1 may count the total number of write operations, read operations, or a mixture of both operations, and only perform a check if the number exceeds 500 or 1000 cycles. Even further embodiments may initiate the charge loss detection process at a system level. For example, apparatus 100 perform the cycle count management using software algorithms in conjunction with processor 112 and read/write controller 142. Apparatus 100 may initiate the check for charge loss once processor 112 and read/write controller 142 have determined that number of the read cycles, write cycles, or combination of read and write cycles exceeds a certain number, such as 500 or 1000 cycles.

Some embodiments may initiate a check for charge loss whenever an ECC module or ECC software is triggered. Such ECC triggering may initiate a detection of charge loss and a refresh of an entire block once the block starts to experience many ECC events. Even further embodiments may assign a device identification number to the apparatus comprising block 200 and initiate a check for charge loss after a certain quantity of time has elapsed. As for the refreshing operation, some embodiments may not rewrite the data back to the same block. For example, if block 134 is empty and block 132 contains data with charge loss, the embodiment may read all the bits out of block 132 and copy them into block 134.

In the embodiment described for block 200 of FIG. 2, BER check WL 215 had a predetermined test pattern of bits in the memory cells, wherein all of the memory cells were set equal to L3. Alternative embodiments may have different predetermined test patterns of bits. One embodiment may have all memory cells programmed to the L2 state, which may be 2 volts. Such an embodiment may apply a sub threshold voltage of 1.8 volts, for example, to detect charge loss before a potential refresh operation. Another embodiment may have a different predetermined pattern of bits. For example, the embodiment may have one memory cell, such as WL memory cell 220, programmed to the L2 state while the next memory cell, such as WL memory cell 265, may be programmed to the L3 state. In such an embodiment, the apparatus containing block 200 may set the voltage of BER check WL 215 below the L2 state and determine if any of the WL memory cells preprogrammed to the L2 state indicate being in that state with a sub-threshold voltage applied. After checking for charge loss of WL memory cells in the L2 state, the embodiment may then check for loss of charge of all cells expected to be in the L3 state. In other words, the embodiment may know which WL memory cells are supposed to be in which states and check for charge loss for memory cells of each particular state, disregarding or ignoring cells programmed to states other than the state currently being checked.

Figure 3:
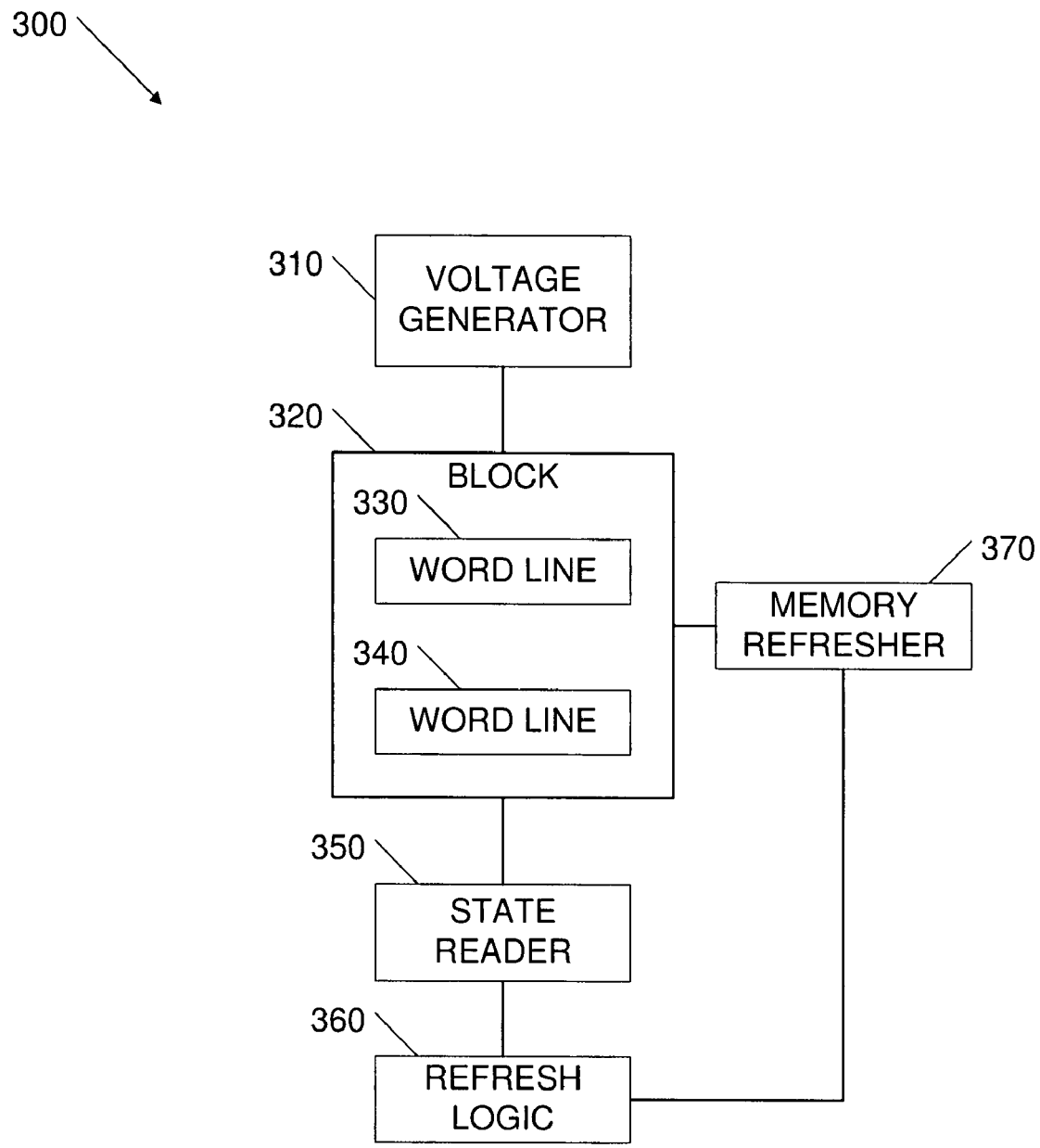
FIG. 3 illustrates an apparatus to refresh non-volatile memory, comprising a voltage generator, a block of non-volatile memory cells, refresh logic, and a memory refresher.

FIG. 3 depicts an apparatus 300 that may be used to refresh non-volatile memory. Apparatus 300 may comprise a voltage generator 310 that may be used to generate threshold and sub-threshold voltages for word lines of a block of memory 320. For example voltage generator 310 may generate threshold voltages substantially equal to 1.0 volts, 2.0 volts, and 3.0 volts for memory cell states L1, L2, and L3, respectively. Voltage generator 310 may also generate sub-threshold voltages such as 0.7 volts, 1.9 volts, and 2.6 volts for each of the respective states. The magnitudes of the sub-threshold voltages may vary from embodiment to embodiment depending on the voltage levels and tolerances of the individual state. For example if the voltage level of an L3 state is 3 volts with a tolerance of +/−0.2 volts for a properly programmed L1 state, then voltage generator 310 may produce a sub-threshold voltage of 2.75 volts, which would be 50 millivolts below an acceptable threshold voltage or state parameter. In some embodiments, voltage generator 310 may produce only sub-threshold voltages for the process of checking for charge loss a block of memory 320, instead of also the generating the threshold voltages used to read data out of word lines containing data.

As shown in FIG. 3 block of memory 320 may contain multiple word lines, such as word line 330 and word line 340. The number of word lines may vary from embodiment to embodiment. For example in one embodiment the number of word lines may equal 32, while the number of word lines in another embodiment may equal 64 or more. Word line 330 may store data. Word line 340 may comprise a bit error rate check word line which may be used to detect when memory cells of block of memory 320 are suffering charge loss. Assuming all of the memory cells coupled to word line 340 have all been programmed to the L1 state, voltage generator 310 may apply a sub-threshold voltage equal to 0.8 volts to word line 340, which may be 200 millivolts below the L1 threshold voltage.

Apparatus 300 may have state reader 350 read the cells of word line 340. For example, state reader 350 may determine the state of the memory cells coupled to word line 340 by sensing the amounts of currents flowing from bit lines coupled to each of the respective cells, such as bit lines 250 and 255 shown in FIG. 2. If one or more of the cells coupled to word line 340 indicate being programmed in the L1 state, despite application of the sub-threshold voltage, then refresh logic 360 may initiate a refresh of memory for block of memory 320. In other words, state reader 350 may determine that the one or more cells coupled to word line 340 violate expected programming for the L1 state by allowing excessive current flow, or current which exceeds a predefined threshold current for the L1 state. Alternative embodiments may detect that the memory cells violate being programmed in the L1 state in a different manner. For example, state reader 350 may count the number of memory cells which become forward biased.

By using refresh logic 360, apparatus 300 may detect charge loss for one or more memory cells coupled to word line 340. Refresh logic 360 may cause memory refresher 370 to refresh all of the memory cells in block of memory 320 or only parts of it, such as all cells programmed to the L1 state or all word lines in close proximity to word line 340. Such an embodiment may have multiple bit error check word lines, instead of only one. Memory refresher 370 may refresh the memory cells of block of memory 320 in different ways depending on the embodiment. In some embodiments, memory refresher 370 may read the data from each of the word lines in block of memory 320 and temporarily store the data in local cache, while other embodiments may temporarily store the data in another type of memory, such as random access memory, coupled to apparatus 300. In even further embodiments, memory refresher 370 may read the data from block of memory 320 and rewrite the data to another block of memory. Such relocation of data may supplement or complement block wear averaging routines of a system coupled to apparatus 300.

Figure 4:
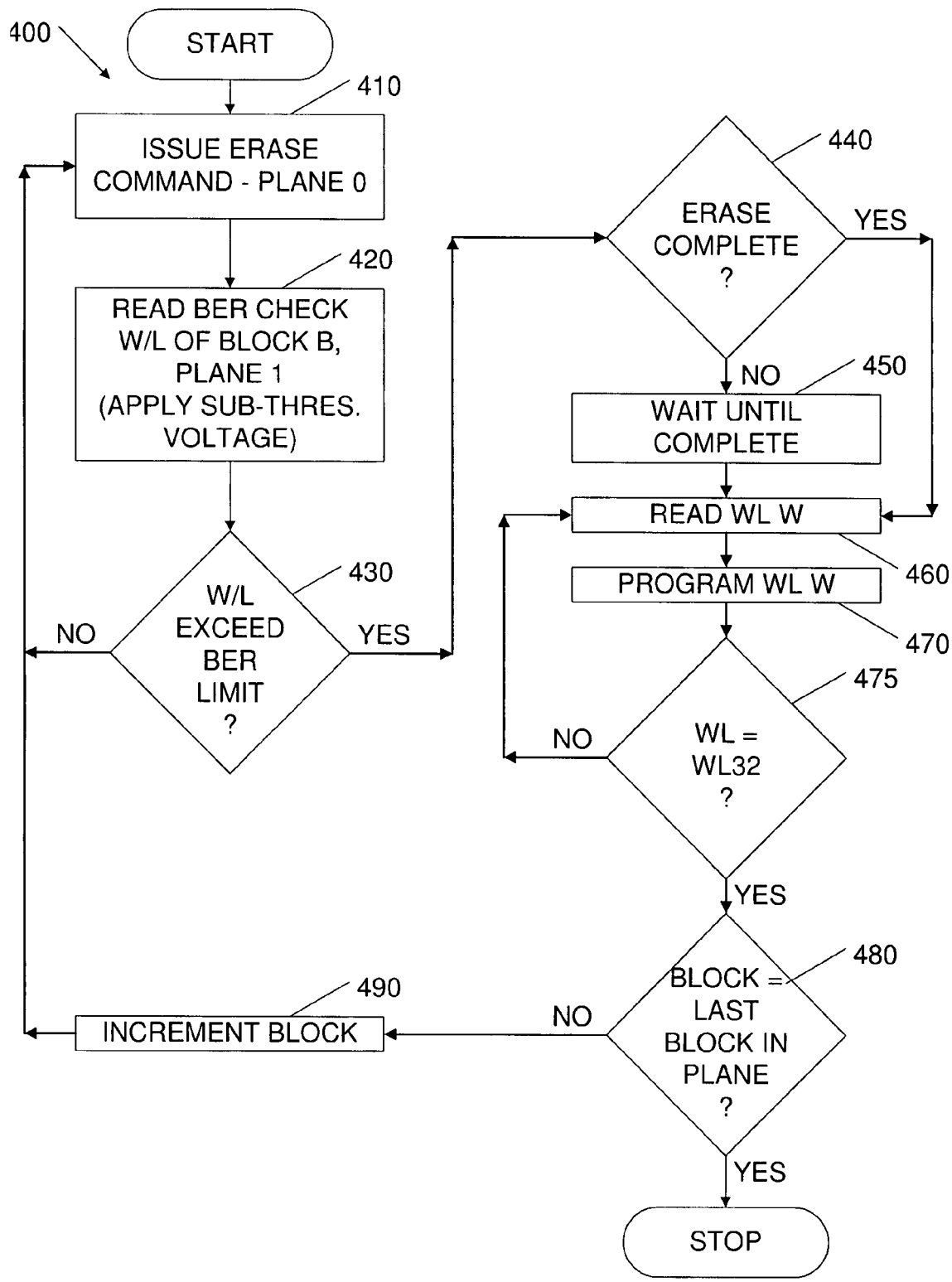
FIG. 4 illustrates an embodiment of a method for refreshing non-volatile memory.

FIG. 4 depicts a flowchart 400 illustrating an embodiment of a method for refreshing non-volatile memory. Flowchart 400 begins with issuing an erase command in plane 0 of a memory block (element 410). For example, an apparatus may issue an erase command for block 134 before detecting and refreshing charge loss for block 132, if block 134 is in plane 0 and block 132 in plane 1. An embodiment according to flowchart 400 may continue by reading a bit error check word line of the block applying a sub-threshold voltage for one or more memory cells of the word line (element 420).

An embodiment according to flowchart 400 may continue by detecting that a memory cell violates a state parameter, such as indicating that the memory cell is in a state despite having a low threshold voltage applied, and that the violation exceeds a bit error rate limit for the word line (elements 420 and 430). If the bit error rate limit is exceeded, an apparatus implementing the method of flowchart 400 may continue by determining if the erase operation of plane 0 is complete (element 440) and waiting until the erase operation of plane 0 is complete if it is not (element 450).

The method of flowchart 400 may then proceed by refreshing the memory cells of the block containing the bit error rate check word line. For example, the method may involve reading individual word lines (element 460) into a temporary memory location and writing or programming data of the individual word lines back into the memory cells of the block (element 470). Upon programming all of the word lines of the block (element 475), an embodiment may then proceed by determining if there are other blocks in plane 1 that may need to be checked for charge loss (element 480). If there are other blocks which need to be checked for charge loss and potentially refreshed, then the method of flowchart 400 may continue by incrementing a block counter which tracks the current block being checked (element 490) and starting the process over again (elements 410, 420, etc.).

Alternative method embodiments may include more elements or have fewer elements. For example, an alternative method embodiment may include activating a read/write controller in order to check for charge loss of a memory block during power-up of an apparatus. Other alternative method embodiments may arrange the elements in a different manner. For example, one method embodiment may first check to see if the word line exceeds the bit error rate limit (element 430) and, if it does not, determine if the block being checked is the last block in the current plane (element 480), and increment the block counter (element 490) before starting the process over again.

It will be apparent to those skilled in the art having the benefit of this disclosure that the embodiments herein contemplate methods and apparatuses for programming non-volatile semiconductor memory devices by using modulated pulses. It is understood that the form of the embodiments shown and described in the detailed description and the drawings are to be taken merely as examples. It is intended that the following claims be interpreted broadly to embrace all the variations of the embodiments disclosed.

Although some aspects have been described in detail for some embodiments, it should be understood that various changes, substitutions and alterations can be made herein without departing from the spirit and scope of the embodiments as defined by the appended claims. Although one embodiment may achieve multiple objectives, not every embodiment falling within the scope of the attached claims will achieve every objective. Moreover, the scope of the present application is not intended to be limited to the particular embodiments of the process, machine, manufacture, composition of matter, means, methods and steps described in the specification. As one of ordinary skill in the art will readily appreciate from the disclosure of the embodiments, processes, machines, manufacture, compositions of matter, means, methods, or steps, presently existing or later to be developed that perform substantially the same function or achieve substantially the same result as the corresponding embodiments described herein may be utilized according to the embodiments herein. Accordingly, the appended claims are intended to include within their scope such processes, machines, manufacture, compositions of matter, means, methods, or steps.

What is claimed is:

1. An apparatus which refreshes non-volatile-memory, comprising:
   a voltage generator to create a voltage to be applied to a bit error rate (BER) check word line (WL) of a block of memory cells, wherein the voltage to be applied is below a threshold voltage of a memory state, wherein further the BER check WL is in addition to data word lines of the block and is to store a test pattern to detect charge loss of memory cells of the data word lines;
   a state reader to determine a state of at least one WL memory cell coupled to the BER check WL; and
   a memory refresher to program a number of memory cells of the data word lines in the block, wherein the memory refresher programs the number of memory cells in response to the state reader determining the at least one of the WL memory cell is in the memory state with the voltage applied.

2. The apparatus of claim 1, further comprising a counter to count a quantity of memory cells that the state reader determines is in the memory state.

3. The apparatus of claim 2, further comprising a BER calculator to determine if the quantity indicates the block has a BER rate which exceeds a predetermined BER.

4. The apparatus of claim 1, further comprising a read/write controller to allow the state reader to determine the states during an erase operation in an unused plane.

5. The apparatus of claim 1, further comprising a read/write controller to allow the state reader to determine the states during a program operation in an unused plane.

6. The apparatus of claim 1, further comprising a read/write controller to allow the state reader to determine the states during power-up of the apparatus, wherein the apparatus comprises one of a laptop computer, a portable memory storage device, a cellular telephone, and a portable media player.

7. The apparatus of claim 1, further comprising a cycle counter to initiate the determination of the state reader when the block encounters a predetermined number of the cycle counter.

8. The apparatus of claim 1, further comprising an error correction code (ECC) initiator to initiate the determination of the state reader when the block experiences an error number of reads requiring error correction.

9. The apparatus of claim 1, wherein WL memory cells coupled to the BER check WL store a predetermined test pattern, wherein the predetermined test pattern comprises a first cell programmed to a first state and a second cell programmed to a second state.

10. The apparatus of claim 1, wherein the test pattern comprises all of the WL memory cells having the same state.

11. A method of refreshing non-volatile memory, the method comprising:
    applying a sub-threshold voltage to a bit error rate (BER) word line (WL) for a plurality of memory cells, wherein the sub-threshold voltage is a number of millivolts below a state threshold voltage for the plurality of memory cells, wherein further the BER check WL is in addition to a plurality of data word lines of a block, wherein further the plurality of memory cells is to store a test pattern to detect charge loss of memory cells of the plurality of data word lines:

detecting at least one memory cell of the plurality of memory cells violates a state parameter; and refreshing the block of memory cells associated with the plurality of memory cells.

12. The method of claim 11, wherein applying the sub-threshold voltage comprises coupling the BER check WL to a voltage supply line with a voltage of approximately 2.7 volts.

13. The method of claim 11, wherein detecting the at least one memory cell of the plurality of memory cells violates the state parameter comprises sensing an amount of current through the at least one memory cell which exceeds a predetermined threshold current of the state.

14. The method of claim 11, wherein detecting the at least one memory cell of the plurality of memory cells violates the state parameter comprises counting a number of the plurality of memory cells which become forward biased.

15. The method of claim 11, wherein refreshing the block of memory cells comprises loading states of cells for each word line of the block into a dynamic data cache and reprogramming the cells for each word line.

* * * * *

UNITED STATES PATENT AND TRADEMARK OFFICE
CERTIFICATE OF CORRECTION

PATENT NO. : 7,535,787 B2  Page 1 of 1
APPLICATION NO. : 11/810550
DATED : May 19, 2009
INVENTOR(S) : Daniel Elmhurst et al.

It is certified that error appears in the above-identified patent and that said Letters Patent is hereby corrected as shown below:

In column 10, line 13, in Claim 1, delete "non-volatile-memory," and insert -- non-volatile memory, --, therefor.

In column 11, line 5, in Claim 11, delete "lines:" and insert -- lines; --, therefor.

Signed and Sealed this

Twenty-fifth Day of August, 2009

David J. Kappos
*Director of the United States Patent and Trademark Office*